(12) United States Patent
Kim

(10) Patent No.: US 7,566,612 B2
(45) Date of Patent: Jul. 28, 2009

(54) METHOD OF FABRICATING CAPACITOR IN SEMICONDUCTOR DEVICE AND SEMICONDUCTOR DEVICE USING THE SAME

(75) Inventor: Jea Hee Kim, Gyeonggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 305 days.

(21) Appl. No.: 11/149,949

(22) Filed: Jun. 10, 2005

(65) Prior Publication Data

US 2005/0287758 A1    Dec. 29, 2005

(30) Foreign Application Priority Data

Jun. 11, 2004    (KR) .................. 10-2004-0042971

(51) Int. Cl.
*H01L 21/8242* (2006.01)
(52) U.S. Cl. .................. 438/239; 438/431; 257/309; 257/E21.061
(58) Field of Classification Search .................. 438/398, 438/431, 239; 257/309, E21.061
See application file for complete search history.

(56) References Cited

U.S. PATENT DOCUMENTS

| | | | | | |
|---|---|---|---|---|---|
| 5,182,232 | A | * | 1/1993 | Chhabra et al. | 438/398 |
| 5,223,081 | A | * | 6/1993 | Doan | 438/703 |
| 6,004,857 | A | * | 12/1999 | Hsiao et al. | 438/396 |
| 6,137,131 | A | * | 10/2000 | Wu | 257/309 |
| 6,337,239 | B1 | * | 1/2002 | Dehm et al. | 438/240 |
| 2003/0224538 | A1 | * | 12/2003 | Miyasaka | 438/3 |
| 2004/0238962 | A1 | * | 12/2004 | Jung et al. | 257/758 |
| 2005/0003669 | A1 | * | 1/2005 | Han et al. | 438/691 |
| 2005/0048794 | A1 | * | 3/2005 | Brask et al. | 438/768 |
| 2006/0211236 | A1 | * | 9/2006 | Bureau et al. | 438/628 |

* cited by examiner

*Primary Examiner*—Asok K Sarkar
*Assistant Examiner*—Julia Slutsker
(74) *Attorney, Agent, or Firm*—The Law Offices of Andrew D. Fortney; Andrew D. Fortney; William K. Nelson

(57) ABSTRACT

A method of fabricating a capacitor in a semiconductor device is provided. The method includes steps of depositing a metal layer for forming a lower electrode on a semiconductor substrate; forming, using an oxidation rate differential, an uneven structure in correspondence with a grain boundary of the metal layer; forming a dielectric layer on the lower electrode having the uneven structure; and forming an upper electrode on the dielectric layer.

19 Claims, 3 Drawing Sheets

METHOD OF FABRICATING CAPACITOR IN SEMICONDUCTOR DEVICE AND SEMICONDUCTOR DEVICE USING THE SAME

This application claims the benefit of Korean Patent Application No. 10-2004-0042971, filed on Jun. 11, 2004, which is hereby incorporated by reference as if fully set forth herein.

BACKGROUND OF THE INVENTION

1. Field of the Invention

The present invention relates to a capacitor in a semiconductor device, and more particularly, to a method of fabricating a capacitor in a semiconductor device and semiconductor device using the same. Although the present invention is suitable for a wide scope of applications, it is particularly suitable for enhancing capacitance and robustness of a capacitor by increasing the effective surface area of the coupling (interface) between upper and lower electrodes of an MIM capacitor.

2. Discussion of the Related Art

Semiconductor memory devices having a chip structure including a memory cell array and a peripheral circuit are being widely used for multimedia function enhancement applications. A core technology in such devices is the fabrication of a capacitor, having a structure comprised essentially of upper and lower electrodes separated by a dielectric (insulating) layer, suitable for a high-speed processing of large quantities of data by providing a very large multitude of such capacitors on a single chip. The capacitor structure may be generally categorized, according to the species of the electrodes, as a polysilicon-insulator-polysilicon (PIP) capacitor or a metal-insulator-metal (MIM) capacitor.

The PIP capacitor, which is typical of a dynamic random access memory device but has been used as an analog-type capacitor, is often favored for design rules of up to 180 nm. The polysilicon used as the upper and lower electrodes of the PIP capacitor, however, increases the specific resistance and may bring about unacceptably high parasitic capacitances due to depletion effects. Therefore, for design rules below 130 nm, the MIM capacitor has been employed. Yet, the metal used as the electrodes of the MIM capacitor exhibits low thermal stability, which prohibits a high-temperature processing (e.g., annealing) of the chip to impart a sufficient device robustness for the formation of complex structures. It should be appreciated that increased capacitance may be achieved through a complex electrode structure formation, which augments (enlarges) the effective surface area between electrodes.

Thus, the MIM capacitor has been limited to a generally flat structure, which tends to increase chip area and thus makes high integration difficult, which is a demand of high-performance memory devices, such as magnetic RAM devices and other next-generation memory devices. Meanwhile, minimum capacitance values are difficult to achieve together with high device integration.

SUMMARY OF THE INVENTION

Accordingly, the present invention is directed to a method of fabricating a capacitor in a semiconductor device and semiconductor device using the same that substantially obviates one or more problems due to limitations and disadvantages of the related art.

An object of the present invention is to provide a method of fabricating a capacitor in a semiconductor device, by which capacitance of the capacitor is raised by increasing the effective surface area of the coupling (interface) between upper and lower electrodes of an MIM capacitor.

An object of the present invention is to provide a semiconductor device suitable to the above method.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, there is provided a method of fabricating a capacitor in a semiconductor device, comprising depositing a metal layer for forming a lower electrode on a semiconductor substrate; forming, using an oxidation rate differential, an uneven structure in correspondence with a grain boundary of the metal layer; forming a dielectric layer on the lower electrode having the uneven structure; and forming an upper electrode on the dielectric layer.

According to another aspect of the present invention, there is provided a semiconductor device having a capacitor, comprising a metal layer for forming a lower electrode on a semiconductor substrate, the metal layer having an uneven structure in correspondence with a grain boundary, the uneven structure formed using an oxidation rate differential; a dielectric layer formed on the lower electrode having the uneven structure; and an upper electrode formed on the dielectric layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, like reference numbers will be used throughout the drawings to refer to the same or similar parts.

FIGS. 1A-1D illustrate a method of fabricating a capacitor in a semiconductor device according to the present invention.

Figure 1A:
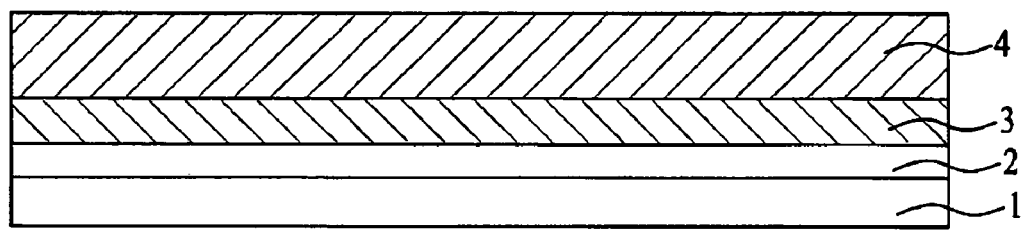
FIGS. 1A-1D are cross-sectional diagrams for a method of fabricating a capacitor in a semiconductor device according to the present invention.

Referring to FIG. 1A, an insulating interlayer 2 is formed on a semiconductor substrate 1 including a prescribed lower layer or subsurface region (not shown). A metal wiring layer 3 of, for example, copper, is typically formed on the insulating interlayer 2 and patterned. A lower electrode 4 is formed on the resulting structure. The lower electrode 4 is a metal layer and may be a stacked formation of titanium nitride and titanium (TiN/Ti), tantalum nitride and titanium (TaN/Ti), or the like.

Figure 1B:
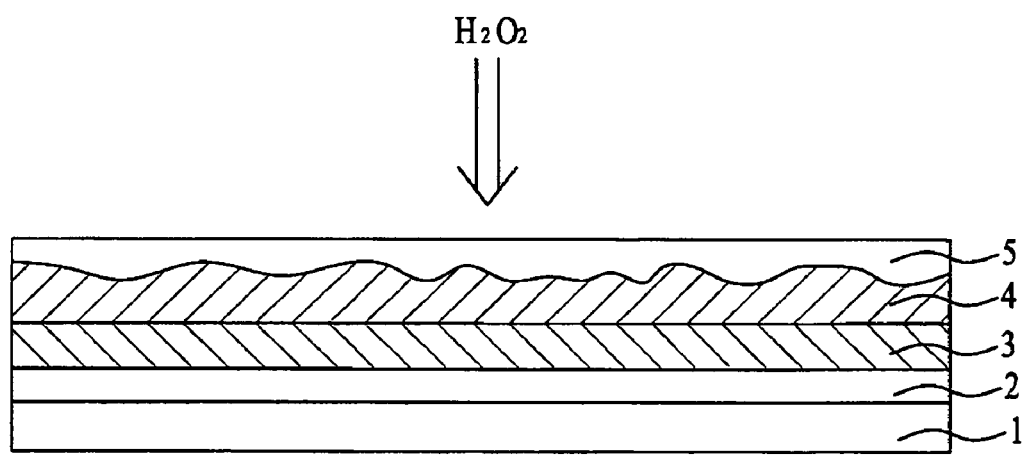
Figure 2:
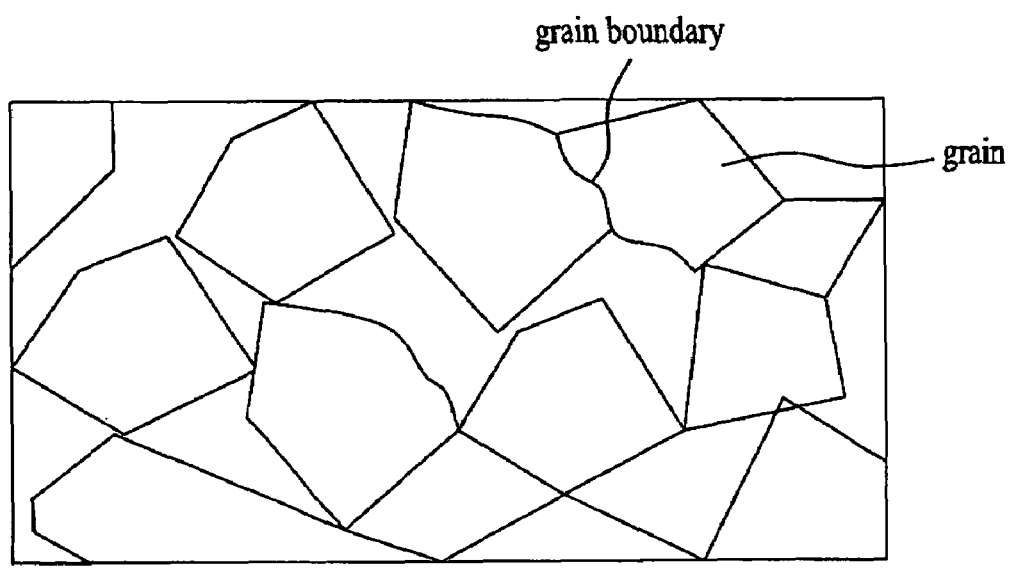
FIGS. 2 and 3 are a plan view and a cross-sectional view, respectively, illustrating grain boundaries present in a lower electrode of a capacitor fabricated according to the method of the present invention.

Referring to FIG. 1B, an upper surface of the lower electrode 4 is oxidized in a bath of hydrogen peroxide ($H_2O_2$). The bath is preferably a $H_2O_2$ solution diluted by deionized water to a ratio of hydrogen peroxide-to-deionized water of 1:2~1:4 and is preferably carried out at a temperature of 65~80° C. In the oxidizing process, a metal oxide layer 5 is produced as the $H_2O_2$ of the bath is resolved into an "$H_2O$" component and an "O" (oxygen) component, the later of which combines with the titanium or other metal of the lower electrode 4 to form, for example, titanium oxide (TiO). In doing so, the oxidization is specifically active along the boundaries of the metal grains of the, for example, titanium. Here, as illustrated in FIG. 2, each "grain" of the material of the metal layer, i.e., the lower electrode 4, is a homogenous structure made up of atoms arranged regularly and repeatedly in a contiguous mass, until reaching the "boundary" of an individual grain, whereupon the abutted structure of another grain immediately adjacent thereto begins. The entire upper surface of the lower electrode 4 is formed of a vast array of irregularly arranged grains each having an irregular shape, and the individual grains are separated at grain boundaries.

Figure 3:
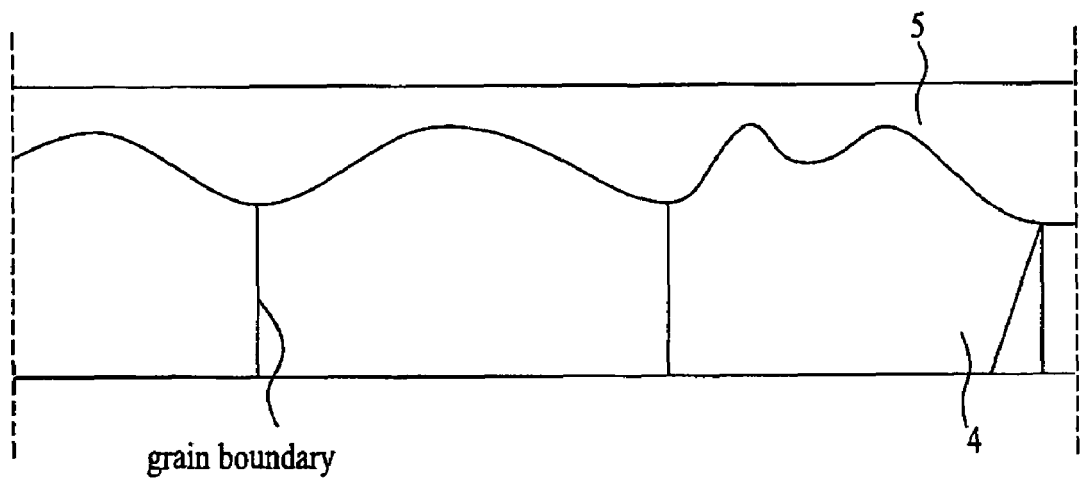

Hence, the oxidation layer 5 is formed thick along the grain boundaries. In other words, the more actively oxidized grain boundaries of the lower electrode 4 become recessed with respect to the interior areas of the grains, to thereby form an uneven surface (uneven structure) in correspondence with a grain boundary of the metal layer, as can be seen in FIG. 3. This unevenness in the upper surface of the lower electrode effectively increases its surface area.

Figure 1C:
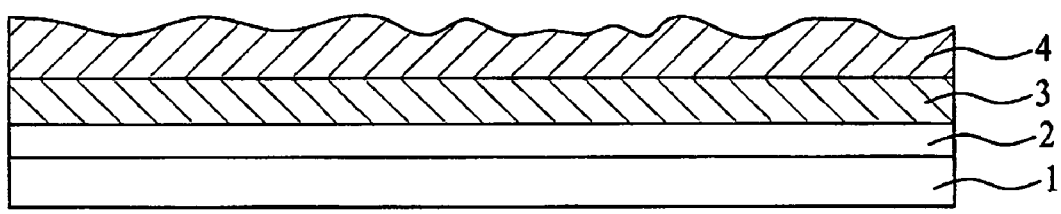

Referring to FIG. 1C, the oxidized surface 5 is etched using hydrofluoric acid (HF) in a vapor state. Here, 39.6% HF is used for the property of its boiling point at the room temperature. That is, by adjusting the temperature of the 39.6% HF, etch selectivity and etch rate can be controlled. The HF in a vapor state has a relatively fast etch rate at the room temperature. As ambient temperature rises, the etch rate is lowered but the metal-to-oxide selection ratio is raised, such that the rate of oxide etching increases in direct proportion to an increase in temperature. Using such a property, the oxidation layer is removed from the lower electrode 4 by allowing 39.6% HF vapor to flow at 45~80° C. for five to fifteen seconds.

Once the oxidation layer 5 is removed from the lower electrode 4 by the above etching, a multitude of prominences and depressions are formed on an upper part of the lower electrode. Moreover, fine particles remaining on the lower electrode 4, which could be undesirably interposed between the lower electrode and an insulating (dielectric) layer to be formed in the next step, are removed while etching and removing the oxidation layer 5. In doing so, the current/voltage (dc/dv) characteristic of the capacitor can be enhanced.

Figure 1D:
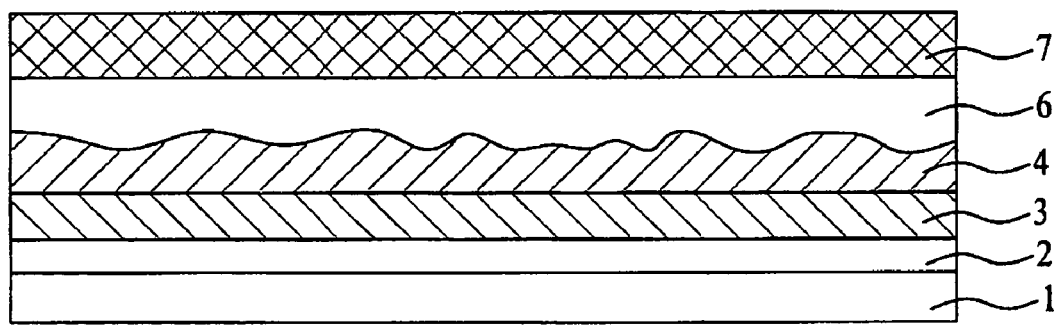

Referring to FIG. 1D, a dielectric layer 6 is formed on the lower electrode 4 having the uneven structure, and an upper electrode 7 is formed on the dielectric layer. The dielectric layer 6 is an insulating layer and may be formed of silicon nitride (SiN), silicon oxide ($SiO_2$), or the like, and the upper electrode 7 is a metal layer and may be a stacked formation of titanium nitride, tantalum nitride, and titanium (TiN/TaN/Ti) or the like. The resulting structure of the upper and lower electrodes 7 and 4 are then patterned as desired to complete the fabrication of a capacitor according to the method of the present invention.

Accordingly, a semiconductor device having a capacitor fabricated according to the method of the present invention comprises a metal layer for forming a lower electrode 4 on a semiconductor substrate 1, a dielectric layer 6 formed on the lower electrode having the uneven structure, and an upper electrode 7 formed on the dielectric layer. According to the present invention, the metal layer has an uneven structure in correspondence with a grain boundary, which is formed using an oxidation rate differential.

By adopting the method of fabricating a capacitor in a semiconductor device according to the present invention, the capacitance of the capacitor is raised by increasing the effective (contact) surface area of the capacitor. Particles between the lower electrode and the insulator can be removed to enhance the current/voltage (dc/dv) characteristic of the capacitor. In addition, a capacitor size for a memory devices, including magnetic RAM devices, can be reduced to decrease an overall chip size.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method of fabricating a capacitor in a semiconductor device, comprising:
   depositing a titanium layer having interfacing metal grains for forming a lower electrode on a semiconductor substrate;
   oxidizing an upper surface of the titanium layer at a temperature of about 65 to 80° C. to form an oxidation layer, wherein an oxidation rate differential exists between interfaces of the metal grains and interior surfaces of the metal grains;
   etching the oxidation layer at a temperature of about 45 to 80° C. to expose an uneven upper surface of the titanium layer in correspondence with the metal grain interfaces of the titanium layer;
   forming a dielectric layer on the titanium layer having the uneven upper surface; and
   forming an upper electrode on the dielectric layer.

2. The method of claim 1, wherein etching the oxidation layer comprises exposing the oxidation layer to hydrofluoric acid (HF) vapor.

3. The method of claim 2, wherein the HF vapor comprises 39.6% HF.

4. The method of claim 3, wherein etching the oxidation layer comprises exposing the oxidation layer to the 39.6% HF vapor at 45~80° C. for five to fifteen seconds.

5. The method of claim 1, wherein said oxidizing an upper surface of the titanium layer comprises immersing said titanium layer in a hydrogen peroxide ($H_2O_2$) bath.

6. The method of claim 5, wherein the $H_2O_2$ bath comprises $H_2O_2$ and deionized water in a hydrogen peroxide-to-deionized water ratio of 1:2~1:4.

7. The method of claim 5, wherein the $H_2O_2$ bath has a temperature of 65~80° C.

8. The method of claim 1, wherein the uneven upper surface of the titanium layer comprises a multitude of prominences at exposed surfaces of the metal grains and depressions at the interfaces.

9. The method of claim 1, wherein etching the oxidation layer removes fine particles remaining on the titanium layer.

10. The method of claim 1, wherein the titanium layer comprises a stack of titanium nitride and titanium (TiN/Ti) or tantalum nitride and titanium (TaN/Ti).

11. The method of claim 1, wherein the dielectric layer comprises silicon nitride (SiN) or silicon oxide ($SiO_2$).

12. The method of claim 1, wherein the upper electrode comprises a stack of titanium nitride, tantalum nitride, and titanium (TiN/TaN/Ti).

13. The method of claim 1, wherein the upper and lower electrodes are patterned to form a capacitor.

14. The method of claim 1, wherein oxidizing the upper surface of the titanium layer comprises oxidizing the interfaces between the metal grains at a higher rate than exposed surfaces of the metal grains.

15. The method of claim 1, further comprising forming an insulating interlayer on or over the semiconductor substrate prior to depositing the titanium layer.

16. The method of claim 15, further comprising forming and patterning a metal wiring layer on or over the insulating interlayer prior to forming the titanium layer.

17. The method of claim 16, wherein the titanium layer is formed on the metal wiring layer.

18. The method of claim 16, wherein the metal wiring layer comprises copper.

19. The method of claim 1, wherein oxidizing the titanium layer comprises forming titanium oxide on a top surface of the metal layer, and the titanium oxide at the interfaces has a greater thickness than at the exposed surfaces of the metal grains.

* * * * *